(12) United States Patent
Xu et al.

(10) Patent No.: US 10,431,499 B2
(45) Date of Patent: Oct. 1, 2019

(54) INSULATING GATE SEPARATION STRUCTURE

(71) Applicant: GLOBALFOUNDRIES Inc., Grand Cayman (KY)

(72) Inventors: Guowei Xu, Ballston Lake, NY (US); Hui Zang, Guilderland, NY (US); Haiting Wang, Clifton Park, NY (US); Yue Zhong, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/134,650

(22) Filed: Sep. 18, 2018

(65) Prior Publication Data
US 2019/0244865 A1 Aug. 8, 2019

Related U.S. Application Data

(62) Division of application No. 15/888,408, filed on Feb. 5, 2018, now Pat. No. 10,153,209.

(51) Int. Cl.
*H01L 21/8238* (2006.01)
*H01L 21/8234* (2006.01)
(Continued)

(52) U.S. Cl.
CPC ........... *H01L 21/823437* (2013.01); *H01L 21/31111* (2013.01); *H01L 21/32133* (2013.01); *H01L 21/823431* (2013.01); *H01L 27/0207* (2013.01); *H01L 27/0886* (2013.01); *H01L 29/66545* (2013.01); *H01L 21/0217* (2013.01);
(Continued)

(58) Field of Classification Search
CPC ..... H01L 21/823437; H01L 21/823481; H01L 29/66545; H01L 21/31111; H01L 27/0886; H01L 27/0207; H01L 21/823431; H01L 21/32133; H01L 21/0274; H01L 21/0217; H01L 21/0228; H01L 21/02164; H01L 21/31053; H01L 21/31144; H01L 21/32139
See application file for complete search history.

(56) References Cited

U.S. PATENT DOCUMENTS

7,547,635 B2 6/2009 Eppler et al.
9,559,205 B2 1/2017 Chang et al.
(Continued)

*Primary Examiner* — Savitri Mulpuri
(74) *Attorney, Agent, or Firm* — Amerson Law Firm, PLLC (57) ABSTRACT

One illustrative integrated circuit product disclosed herein includes a first final gate structure for a first transistor device, a second final gate structure for a second transistor device, the first and second transistors having a gate width direction and a gate length direction that is substantially normal to the gate width direction, and an insulating gate separation structure positioned between the first and second final gate structures, the insulating gate separation structure comprising an upper portion and a lower portion, the lower portion having a first lateral width in the gate width direction that is substantially uniform throughout a vertical height of the lower portion, the upper portion having a substantially uniform second lateral width in the gate width direction that is substantially uniform throughout a vertical height of the upper portion, wherein the second lateral width is less than the first lateral width.

13 Claims, 7 Drawing Sheets

(51) Int. Cl.
*H01L 27/02* (2006.01)
*H01L 27/088* (2006.01)
*H01L 21/311* (2006.01)
*H01L 29/66* (2006.01)
*H01L 21/3213* (2006.01)
*H01L 21/3105* (2006.01)
*H01L 21/02* (2006.01)
*H01L 21/027* (2006.01)

(52) U.S. Cl.
CPC ...... *H01L 21/0228* (2013.01); *H01L 21/0274* (2013.01); *H01L 21/02164* (2013.01); *H01L 21/31053* (2013.01); *H01L 21/31144* (2013.01); *H01L 21/32139* (2013.01)

(56) References Cited

U.S. PATENT DOCUMENTS

2013/0037886 A1* 2/2013 Tsai ................ H01L 21/823821
257/351
2017/0033196 A1 2/2017 Greene et al.

* cited by examiner

INSULATING GATE SEPARATION STRUCTURE

BACKGROUND

1. Field of the Disclosure

The present disclosure generally relates to the fabrication of integrated circuits, and, more particularly, to various embodiments of an insulating gate separation structure and methods of making such insulating gate separation structures.

2. Description of the Related Art

In modern integrated circuits, such as microprocessors, storage devices and the like, a very large number of circuit elements, especially transistors, are provided on a restricted chip area. Field Effect Transistors ("FETs") come in a variety of shapes and forms, e.g., planar transistors, FinFET transistors, vertical transistors, nanowire devices, etc.

Figure 1:
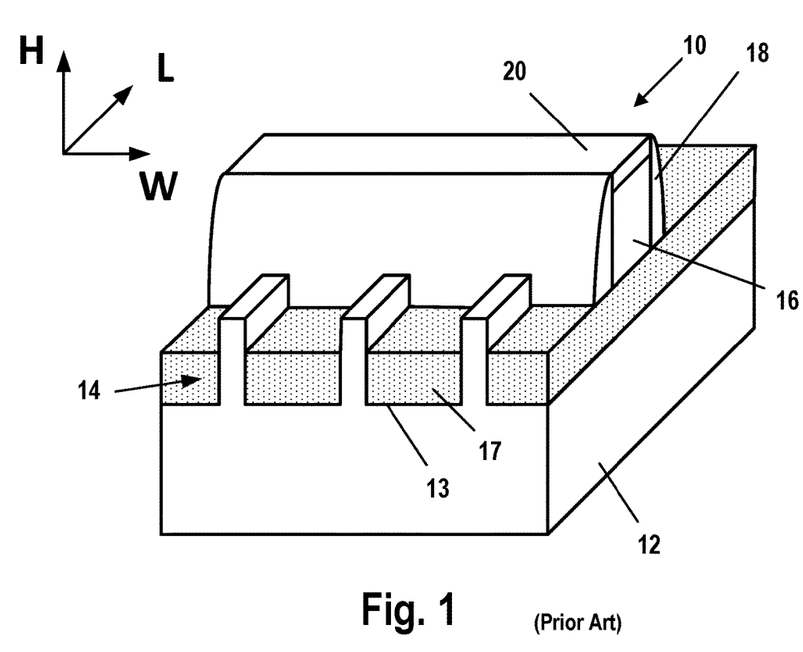
FIG. 1 is a simplistic depiction of an illustrative prior art FinFET device.

A conventional planar FET is a planar device wherein the entire channel region of the device is formed approximately parallel to and slightly below the planar upper surface of the semiconductor substrate. In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12, wherein the fins 14 of the device 10 are made of the material of the substrate 12, e.g., silicon. The device 10 includes a plurality of fin-formation trenches 13, three illustrative fins 14, a gate structure 16, a sidewall spacer 18 and a gate cap 20. The spacer 18 is typically made of silicon nitride, but in some cases it may be made of a material having a lower dielectric constant (k) than that of silicon nitride. An insulating material 17, e.g., silicon dioxide, provides electrical isolation between the fins 14. The fins 14 have a three dimensional configuration: a height H, a width W and an axial length L. The axial length L corresponds to the gate length of the device, i.e., the direction of current travel in the device 10 when it is operational. The gate width of the device 10 is orthogonal to the gate length direction. The portions of the fins 14 covered by the gate structure 16 are the channel regions of the FinFET device 10. The portions of the fins 14 that are positioned outside of the spacers 18 will become part of the source/drain regions of the device 10.

For many FET devices, the gate structures are initially formed as continuous line-type structures that extend across the entire substrate, including across both active regions and isolation regions. In advanced integrated circuit (IC) products, the gate structures for the transistor devices are typically manufactured using the well-known replacement gate (or "gate-last") manufacturing technique. In general, the replacement gate manufacturing technique involves the formation of a sacrificial (or "dummy") gate structure comprised of a sacrificial gate insulation layer (e.g., silicon dioxide) and a layer of a sacrificial gate electrode material (e.g., polysilicon or amorphous silicon). Various process operations are performed with the sacrificial gate structure in position, e.g., source/drain implantation processes, the formation of epi semiconductor material in the source/drain regions of the transistor devices, etc. At some point in the manufacturing process, the sacrificial gate structure will be removed to define a replacement gate cavity. Thereafter, materials for the replacement gate structure will be formed in the replacement gate cavity and a final gate cap will be formed over the replacement gate structure. In advanced devices, such a replacement gate structure may comprise a high-k (k value of 10 or greater) gate insulation layer and one or more metal-containing layers of material that collectively function as the conductive gate electrode for the replacement gate structure.

For many FET devices, the initial sacrificial gate structures are initially formed as continuous line-type structures that extend across the entire substrate, including across both active regions and isolation regions. The long continuous line-type sacrificial gate structures are formed by depositing the materials for the sacrificial gate structures across the entire substrate, forming a patterned gate etch mask above the deposited sacrificial gate materials and performing one or more etching processes through the patterned gate etch mask to remove the exposed portions of the sacrificial gate materials. At that point, a spacer structure will be formed adjacent the long continuous line-type sacrificial gate structures. As noted above, at some point after other processing has occurred, e.g., after formation of epi material in the source/drain regions of the devices, portions of the long continuous line-type sacrificial gate structures will be removed or "cut" so as to define individual portions or segments of the original long continuous line-type sacrificial gate structures which will eventually be removed and replaced with final replacement gate structures. After the cutting process is completed, there is a "tip-to-tip" spacing between the individual sacrificial gate structures. The tip-to-tip spacing between the sacrificial gate structures is typically filled with an insulation material.

As device dimensions continue to decrease and as packing densities of transistor devices on a substrate continue to increase, various problems have arisen as it relates to manufacturing replacement gate structures on transistor devices. More specifically, as device scaling continues, the vertical height of the sacrificial gate structures has increased, while the lateral width (i.e., gate length or critical dimension) of the sacrificial gate structures has decreased. As a result, the aspect ratio (height/lateral width) has increased, thereby making the cutting of the sacrificial gate structures into individual segments more problematic. For example, given the increased aspect ratio of the sacrificial gate structures on more advanced devices, the act of cutting the sacrificial gate structures may be incomplete in that undesirable residual amounts of the sacrificial gate material may remain in place after the cutting process is completed. The presence of such undesirable residual materials from the sacrificial gate structures may make the formation of quality replacement gate structures more difficult and such residual material may result in decreased device performance or complete device failure.

The present disclosure is directed to various embodiments of an insulating gate separation structure and method of making such insulating gate separation structures that may eliminate or at least reduce one or more of the problems identified above.

SUMMARY

The following presents a simplified summary of the disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to various embodiments of an insulating gate separation structure and method of making such insulating gate separation structures. One illustrative integrated circuit product disclosed herein includes a first final gate structure for a first transistor device, a second final gate structure for a second transistor device, the first and second transistors having a gate width direction and a gate length direction that is substantially normal to the gate width direction, and an insulating gate separation structure positioned between the first and second final gate structures, the insulating gate separation structure comprising an upper portion and a lower portion, the lower portion having a first lateral width in the gate width direction that is substantially uniform throughout a vertical height of the lower portion, the upper portion having a substantially uniform second lateral width in the gate width direction that is substantially uniform throughout a vertical height of the upper portion, wherein the second lateral width is less than the first lateral width.

Another illustrative integrated circuit product disclosed herein includes a first final gate structure for a first transistor device, a second final gate structure for a second transistor device, the first and second transistors having a gate width direction and a gate length direction that is substantially normal to the gate width direction, and an insulating gate separation structure positioned between the first and second final gate structures, the insulating gate separation structure comprising an upper portion and a lower portion, the lower portion having a first lateral width in the gate width direction, the upper portion having a second lateral width in the gate width direction, wherein the second lateral width is less than the first lateral width and wherein, when viewed in a cross-section taken through the gate separation structure in the gate width direction, the gate separation structure has an inverted "T" configuration.

Another illustrative integrated circuit product disclosed herein includes a first final gate structure for a first transistor device comprising a first end surface, a second final gate structure for a second transistor device comprising a second end surface, the first and second transistors having a gate width direction and a gate length direction that is substantially normal to the gate width direction, and an insulating gate separation structure positioned between the first and second final gate structures, the insulating gate separation structure comprising an upper portion and a lower portion, the lower portion having a first lateral width in the gate width direction that is substantially uniform throughout a vertical height of the lower portion, the upper portion having a substantially uniform second lateral width in the gate width direction that is substantially uniform throughout a vertical height of the upper portion, wherein the second lateral width is less than the first lateral width and wherein the insulating gate separation structure has a substantially uniform third lateral width in the gate length direction throughout an overall vertical height of the gate separation structure, wherein the first end surface engages both the upper portion and the lower portion of the insulating gate separation structure on a first side of the insulating gate separation structure and the second end surface engages both the upper portion and the lower portion of the insulating gate separation structure on a second side of the insulating gate separation structure that is opposite the first side.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of an insulating gate separation structure, methods of making such insulating gate separation structures and integrated circuit (IC) products that include such insulating gate separation structures. As will be readily apparent to those skilled in the art upon a complete reading of the present application, the presently disclosed methods may be employed when forming transistor devices having a variety of different configurations, e.g., planar transistor devices, vertical transistor devices, FinFET devices, etc. The illustrative examples described and depicted herein involve use of the methods disclosed herein to form an IC product 100 comprised of illustrative FinFET devices. However, the presently disclosed inventions should not be considered to be limited to any particular type or form of transistor device. Moreover, the methods and devices disclosed herein may be employed when forming a variety of products, including, but not limited to, logic products, memory products, etc. With reference to the attached figures, various illustrative embodiments of the methods and devices disclosed herein will now be described in more detail.

Figure 2:
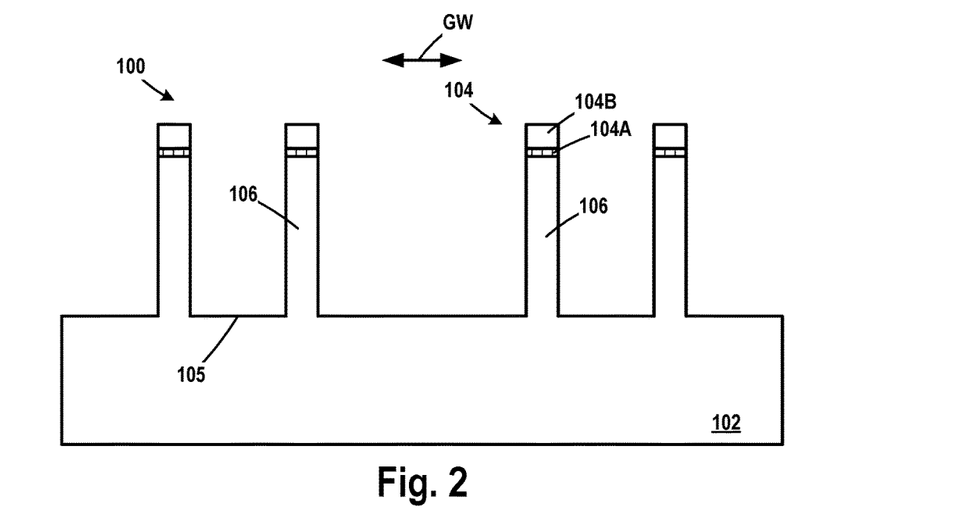
FIGS. 2-13 depict various embodiments of an insulating gate separation structure and method of making such insulating gate separation structures.

FIG. 2 depicts an IC product 100 that is formed in and above a semiconductor substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices disclosed herein are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials. It should be noted that the final gate structure for the transistor devices disclosed herein may be formed by performing well-known replacement gate manufacturing techniques. Additionally, various doped regions, e.g., halo implant regions, doped source/drain regions, well regions and the like, are not depicted in the attached drawings. The transistor devices depicted herein may be either NMOS or PMOS transistors. The various components and structures of the transistor devices disclosed herein may be formed using a variety of different materials and by performing a variety of known techniques, e.g., a chemical vapor deposition (CVD) process, an atomic layer deposition (ALD) process, a thermal growth process, spin-coating techniques, epi growth processes, etc. The thicknesses of these various layers of material may also vary depending upon the particular application.

FIG. 2 depicts the product 100 after a plurality of fins 106 was formed in the substrate 102. FIG. 2 is a cross-sectional view of the product 100 that is taken through the fins 106 at a location where gate structures (not shown) will be formed for first and second FinFET devices. The cross-sectional view in FIG. 2 is taken in a direction that corresponds to the gate width (GW) direction of the transistor devices.

With continuing reference to FIG. 2, in the example depicted herein, each of the illustrative FinFET devices will be depicted as comprising two illustrative fins 106. Of course, the FinFET devices may be comprised of a single fin 106 or more than the two illustrative fins 106 depicted herein. In one illustrative example, the fins 106 were formed by performing one or more etching processes, e.g., anisotropic etching processes, through a patterned fin-formation etch mask 104 to form a plurality of fin-formation trenches 105 in the substrate 102 and thereby define the plurality of fins 106. The patterned fin-formation etch mask 104 is intended to be representative in nature as it may be comprised of multiple layers of material, such as, for example, the depicted silicon dioxide layer 104A and the silicon nitride layer 104B. Thus, the particular form and composition of the patterned fin-formation etch mask 104 should not be considered a limitation of the presently disclosed inventions.

The lateral width and vertical height of the fins 106 may vary depending upon the particular application. Additionally, the overall size, shape and configuration of the fin-formation trenches 105 and the fins 106 may vary depending on the particular application. In the illustrative examples depicted in the attached drawings, the fin-formation trenches 105 and the fins 106 are all depicted as having a uniform size and shape. However, such uniformity in the size and shape of the trenches 105 and the fins 106 is not required to practice at least some aspects of the inventions disclosed herein. In the attached figures, the fin-formation trenches 105 are depicted as having been formed by performing an anisotropic etching process that results in the fins 106 having a schematically (and simplistically) depicted, generally rectangular configuration. In an actual real-world device, the sidewalls of the fins 106 may be somewhat outwardly tapered (i.e., the fins may be wider at the bottom of the fin than they are at the top of the fin) although that configuration is not depicted in the attached drawings. Thus, the size and configuration of the fin-formation trenches 105 and the fins 106, and the manner in which they are made, should not be considered a limitation of the presently disclosed inventions. For ease of disclosure, only the substantially rectangular trenches 105 and fins 106 will be depicted in the subsequent drawings.

Figure 3:
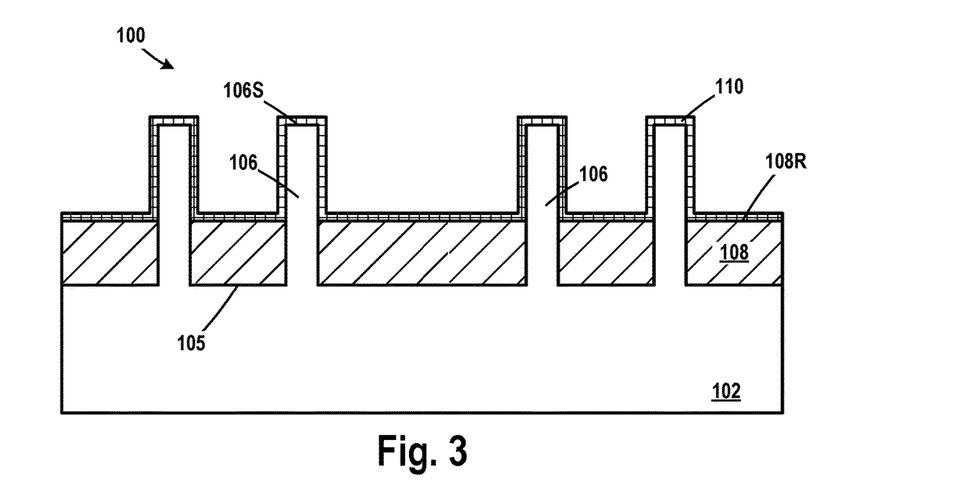

FIG. 3 depicts the product 100 after several process operations were performed. First, a layer of insulating material 108, such as silicon dioxide, was deposited so as to overfill the trenches 105 such that insulating material 108 was positioned above the upper surface of the patterned etch mask 104. Thereafter, a chemical mechanical polishing (CMP) process was performed to planarize the upper surface of the deposited layer of insulating material 108 with the upper surface of the patterned etch mask 104. Then, a recess etching process was performed to recess the layer of insulating material 108 such that it has a recessed upper surface 108R that exposes a portion of the vertical height of the fins 106. The amount of recessing of the layer of insulating material 108 may vary depending upon the particular application. Thereafter, one or more etching processes were performed to remove the patterned etch mask 104 relative to the surrounding materials so as to expose the upper surface 106S of the fins 106.

As noted above, the gate structures for the transistor devices will be manufactured using a unique replacement gate manufacturing process disclosed herein. Accordingly, still referencing FIG. 3, a conformal deposition process, e.g., a conformal ALD process, was performed to form a conformal sacrificial gate insulation layer 110 on the product 100. Alternatively, the sacrificial gate insulation layer 110 could also be formed by performing a thermal growth process, wherein the thermally grown sacrificial gate insulation layer would only form on the exposed portions of the fins 106. The thickness and material of construction for the sacrificial gate insulation layer 110 may vary depending upon the particular application. In one illustrative embodiment, the sacrificial gate insulation layer 110 may be comprised of silicon dioxide. In the depicted example, wherein the illustrative transistor devices are FinFET devices, a conformal deposition process was performed to form the sacrificial gate insulation layer 110. However, the formation of such a conformal sacrificial gate insulation layer 110 may not be required in all applications. For example, when the transistor devices are planar devices, the sacrificial gate insulation layer 110 may be formed by forming a non-conformal deposition process or a thermal growth process.

Figure 4:
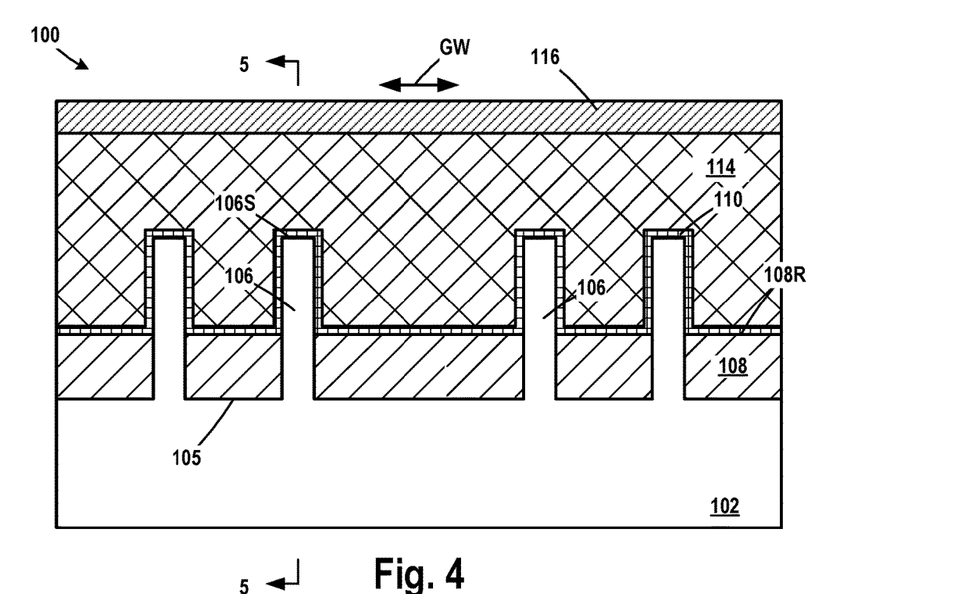
Figure 5:
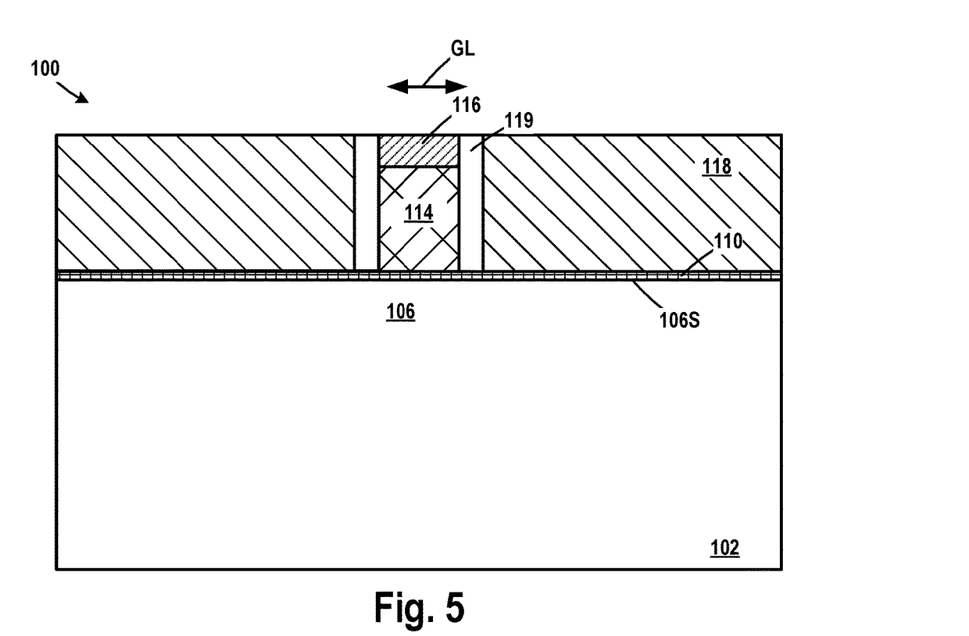

FIGS. 4 and 5 depict the product 100 after several process operations were performed. FIG. 5 is a cross-sectional view taken through one of the fins 106 where indicated in FIG. 4 in a direction corresponding to the gate length (GL) or current transport direction of the transistor devices. First, a blanket deposition process was performed to form a sacrificial gate electrode material layer 114 on the sacrificial gate insulation layer 110. In one illustrative example, the sacrificial gate electrode material layer 114 may be comprised of polysilicon, amorphous silicon, etc. Although not depicted in the drawings, after the sacrificial gate electrode material layer 114 is initially deposited, its upper surface may be uneven, as it will tend to have high spots at locations above the fins 106 and low spots in areas between the fins 106, i.e., its upper surface will comprise peaks and valleys. Ultimately, it is desirable that the upper surface of the sacrificial gate electrode material layer 114 be substantially planar prior to performing additional process operations. In one embodiment, this may be accomplished by forming a relatively thin layer of silicon dioxide so as to overfill the valleys in the upper surface of the sacrificial gate electrode material layer 114, performing a CMP process to planarize the upper surfaces of the silicon dioxide and sacrificial gate electrode material layer 114, and thereafter performing an etching process that is non-selective relative to the layer of silicon dioxide and the material of the sacrificial gate electrode material layer 114. This etching process is performed until all of the silicon dioxide material is removed, thereby leaving the sacrificial gate electrode material layer 114 with the substantially planar upper surface depicted in FIG. 4. The layers of material 110 and 114 are formed across the entire substrate 102.

With continuing reference to FIGS. 4 and 5, a plurality of etching processes will be performed to pattern at least the sacrificial gate electrode material layer 114 so as to form a plurality of continuous line-type structures that extend across the substrate 102. In some applications, the sacrificial gate insulation layer 110 may also be patterned at this point in the process flow, but such a situation is not depicted in the drawings. Forming these continuous line-type structures may be accomplished by forming a patterned etch mask 116, e.g., a patterned layer of silicon nitride, that is comprised of a plurality of line-type features above the layer 114 and thereafter performing one or more etching processes through the patterned etch mask 116 to remove the exposed portions of the sacrificial gate electrode material layer 114. The patterned etch mask 116 may be formed using traditional photolithography and etching processes. After the completion of the etching processes, each of the individual features of the patterned etch mask 116 may serve as a gate cap for one of the continuous line-type sacrificial gate structures comprised of the sacrificial gate electrode material layer 114 and the sacrificial gate insulation layer 110. Then, as shown in FIG. 5, a simplistically depicted sidewall spacer 119 may be formed adjacent the sidewalls of the continuous line-type sacrificial gate structures by performing traditional spacer manufacturing techniques, i.e., depositing a conformal layer of spacer material and performing an anisotropic etching process. With reference to FIG. 5, a layer of insulating material 118, e.g., silicon dioxide is then deposited on the product 100 and a CMP process is performed to planarize the upper surface of the layer of insulating material 118 with the upper surface of the gate cap 116.

Figure 6:
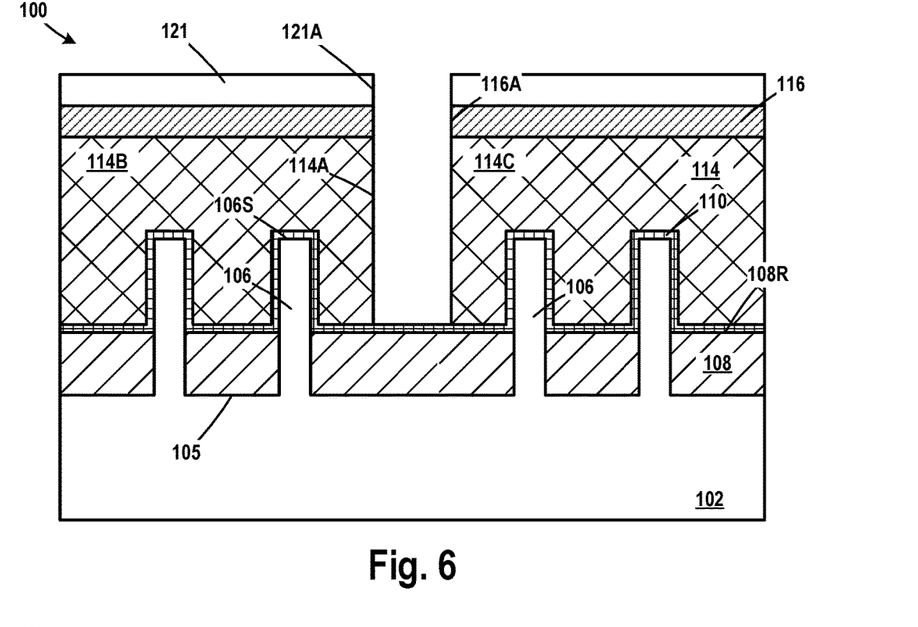

FIG. 6 depicts the product 100 after several process operations were performed. First, a patterned mask layer 121, e.g., a patterned layer of photoresist, with an opening 121A formed therein, was formed above the gate cap 116 and the sacrificial gate electrode material layer 114. The opening 121A is positioned at a location where it is desired to cut or remove the materials of the sacrificial gate structure. With continuing reference to FIG. 6, a first anisotropic etching process was performed through the opening 121A to form an opening 116A in the gate cap 116 that exposes a portion of the sacrificial gate electrode material layer 114. Thereafter, another anisotropic etching process was performed through the opening 116A to remove portions of at least the sacrificial gate electrode material layer 114. In the depicted example, this etching process stops on the sacrificial gate insulation layer 110. In practice, the exposed portions of the sacrificial gate insulation layer 110 may also be removed. This process forms opening an 114A in the sacrificial gate electrode material layer 114. At the completion of the etching process (either isotropic or anisotropic), the sacrificial gate electrode material layer 114 is cut into a first portion 114B and a second portion 114C.

Figure 7:
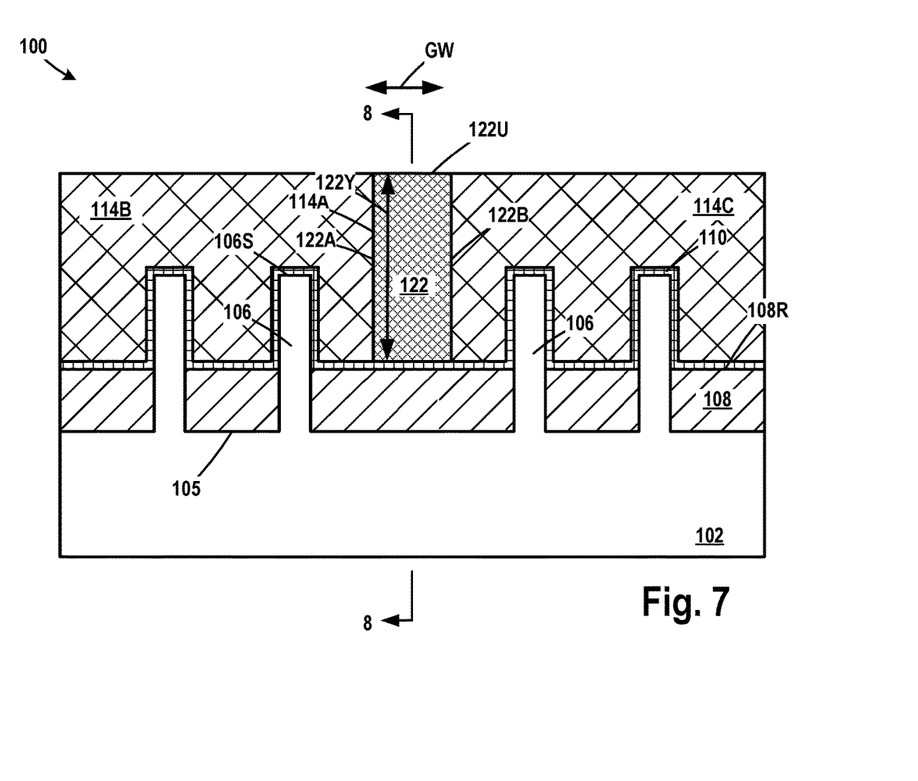
Figure 8:
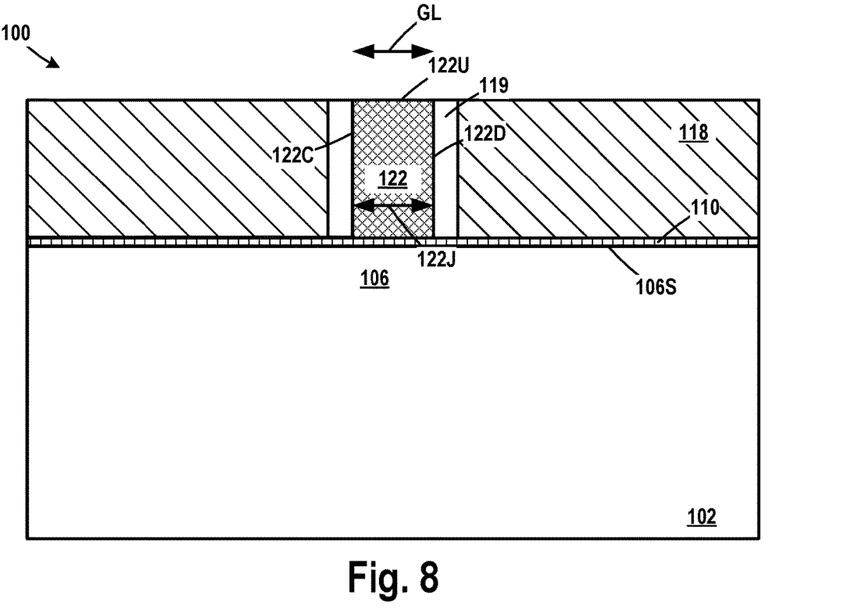

FIGS. 7 and 8 depict the product after several process operations were performed. FIG. 8 is a cross-sectional view taken where indicated in FIG. 7 in a direction corresponding to the gate length direction of the transistor devices. First, the patterned etch mask 121 was removed. Thereafter, a deposition process was performed so as to overfill the opening 114A with an insulating material, e.g., silicon nitride. Thereafter, one or more CMP process operations and/or etch-back process operations were performed that stop on the upper surface of the sacrificial gate electrode material layers 114B, 114C. This process operation removes excess amounts of the insulating material as well as the gate cap 116. The remaining insulating material in the opening 114A constitutes an initial insulating gate separation structure 122 with an upper surface 122U and an overall vertical height 122Y. The initial insulating gate separation structure 122 also has a substantially uniform nominal width 122W (in the gate width (GW) direction of the transistor devices) (see FIG. 9) throughout its vertical height 122Y, and a substantially uniform nominal width 122J (in the gate length (GL) direction of the transistor devices) throughout its vertical height 122Y. The widths 122W and 122J may vary depending upon the particular application. In one illustrative example, the width 122W may be about 20-40 nm, while the width 122J may be about 16-24 nm. The initial insulating gate separation structure 122 has first and second opposing side surfaces 122A, 122B, respectively, when viewed in a cross-section taken in the gate width direction of the devices (as shown in FIG. 7). With reference to FIG. 8, the initial insulating gate separation structure 122 also has third and fourth opposing side surfaces 122C, 122D, respectively, when viewed in a cross-section taken in the gate length direction of the devices. Note that the side surfaces 122C, 122D engage the spacer 119 along the entire height 122Y of the initial insulating gate separation structure 122. At the completion of these process operations, the materials of the sacrificial gate structure on opposite sides of the initial insulating gate separation structure 122 are now exposed for further processing.

Figure 9:
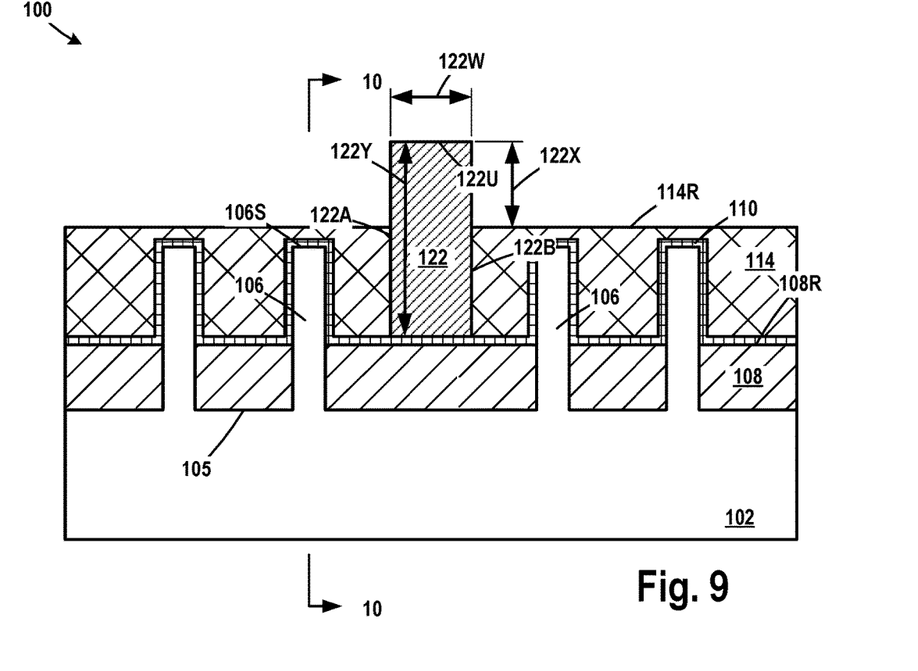
Figure 10:
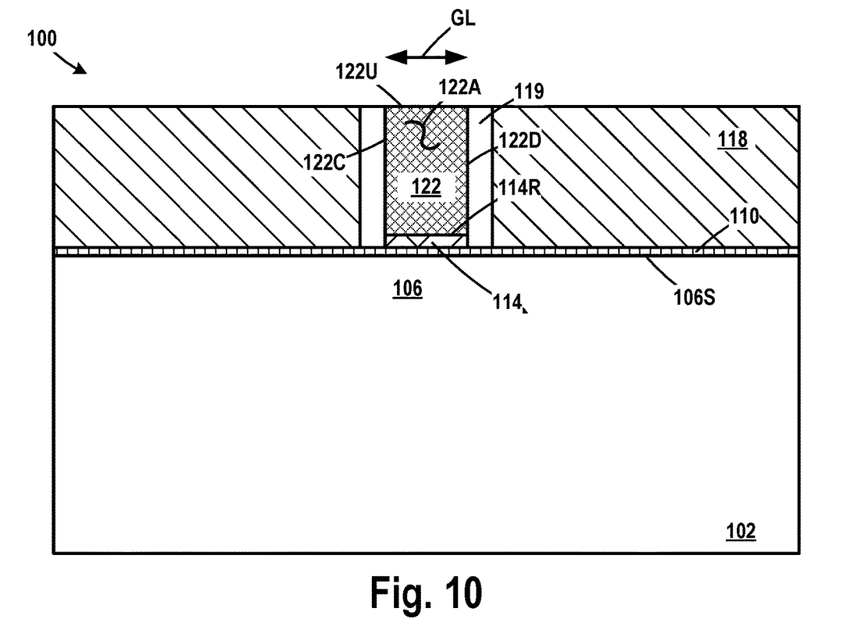

FIGS. 9 and 10 depict the product after a recess etching process was performed to recess the sacrificial gate electrode material layer 114 such that it has a recessed upper surface 114R that exposes an upper portion 122X of the initial insulating gate separation structure 122. FIG. 10 is a cross-sectional view taken where indicated in FIG. 9 through one of the fins 106 in a direction corresponding to the gate length direction of the transistor devices. The amount of recessing of the sacrificial gate electrode material layer 114 may vary depending upon the particular application. In general, in one illustrative embodiment, at the completion of the recess etching process, the recessed upper surface 114R is positioned at a level that is above (e.g., 5-10 nm) a level of the upper surface 106S of the fins 106. The initial insulating gate separation structure 122 has an overall vertical height 122Y. In some applications, the upper exposed portion 122X of the initial insulating gate separation structure 122 may have a vertical height that is equal to about 40-70% of the overall vertical height 122Y of the initial insulating gate separation structure 122.

Figure 11:
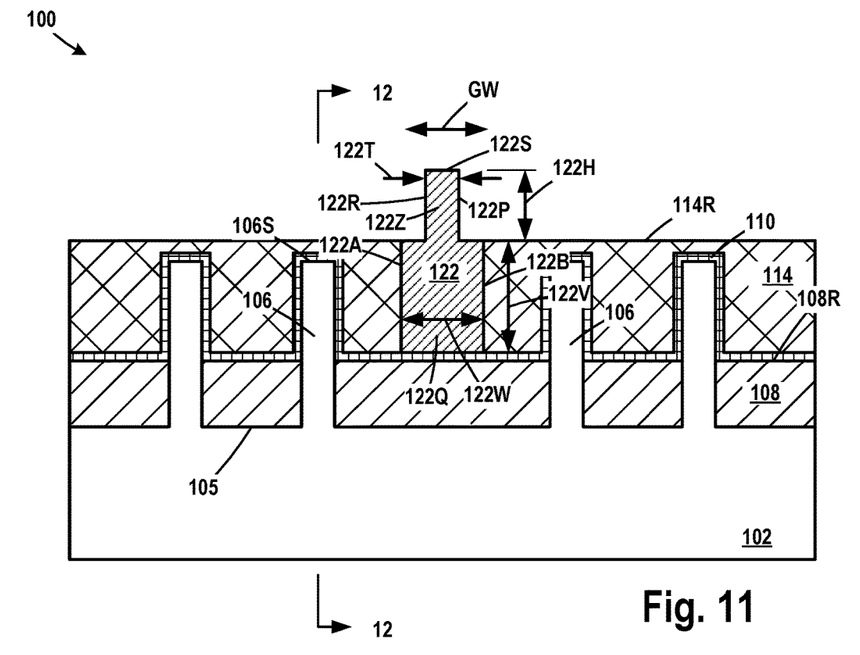
Figure 12:
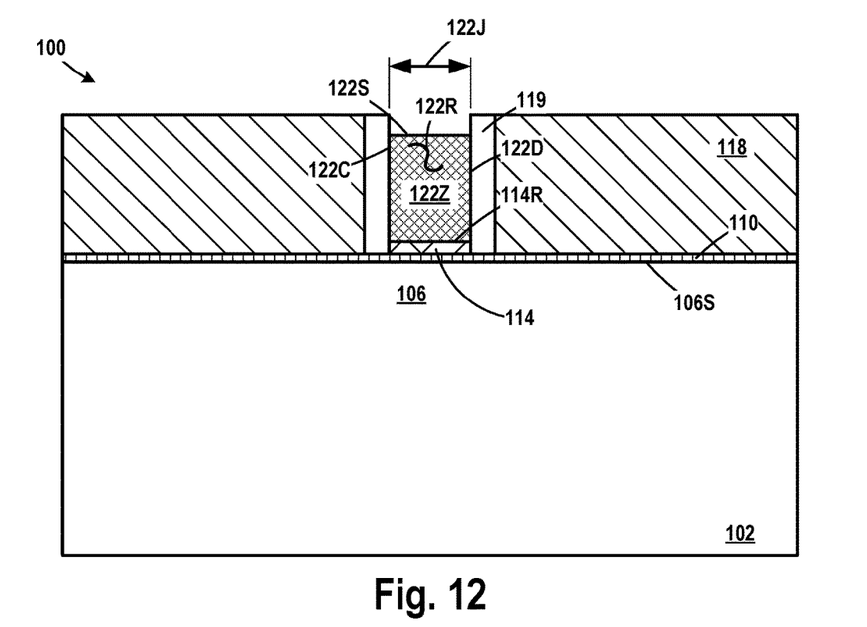

FIGS. 11 and 12 depict the product after an isotropic etching process was performed to reduce the lateral width (in the gate width direction) of the upper exposed portion 122X (see FIG. 9) of the initial insulating gate separation structure 122 to produce a final insulating gate separation structure 122 that includes a recessed or trimmed upper exposed portion 122Z and an untrimmed lower portion 122Q. FIG. 12 is a cross-sectional view taken where indicated in FIG. 11 through one of the fins 106 in a direction corresponding to the gate length direction of the transistor devices. As indicated in FIG. 11, after this trimming etch process is performed, the trimmed upper exposed portion 122Z of the final insulating gate separation structure 122 has a substantially uniform nominal width 122T (in the gate width (GW) direction of the transistor devices) throughout its vertical height 122H.

Additionally, after this trimming etch process is performed, the untrimmed lower portion 122Q of the final insulating gate separation structure 122 has a substantially uniform nominal width 122W (in the gate width (GW) direction of the transistor devices) throughout its vertical height 122V. During this trimming etch process, some of the original vertical height 122X (see FIG. 9) of the untrimmed upper exposed portion 122Z of the initial insulating gate separation structure 122 was consumed. Thus, after this etching process, the trimmed upper exposed portion 122Z of the final insulating gate separation structure 122 has a lower upper surface 122S and an overall height 122H. The width 122T may vary depending upon the particular application. In some applications, the trimmed upper exposed portion 122Z of the final insulating gate separation structure 122 may have a width 122T that is equal to about 40-70% of the width 122W of the remaining lower portion 122Q of the final insulating gate separation structure 122 that remains below the recessed surface 114R of the sacrificial gate electrode materials 114. In one illustrative example, the width 122T may be about 10-30 nm. The trimmed upper exposed portion 122Z of the final insulating gate separation structure 122 has first and second opposing side surfaces 122R, 122P, respectively, when viewed in a cross-section taken in the gate width direction of the devices (as shown in FIG. 11). Both the trimmed upper exposed portion 122Z and the untrimmed lower portion 122Q still have third and fourth opposing side surfaces 122C, 122D, respectively, when viewed in a cross-section taken in the gate length direction of the devices, that engage the spacer 119. As best seen in FIG. 11, the combination of the trimmed upper exposed portion 122Z, with its relatively narrower width 122T, and the remaining lower portion 122Q of the final insulating gate separation structure 122, with the relatively wider width 122W, forms an overall final insulating gate separation structure 122 with a stepped configuration that exhibits an abrupt transition between the trimmed upper exposed portion 122Z and the untrimmed lower portion 122Q of the final insulating gate separation structure 122. Stated another way, the final insulating gate separation structure 122 disclosed herein has an upper portion 122Z with a first substantially uniform nominal width 122T (in the gate width (GW) direction of the transistor devices) throughout its vertical height 122H and a lower portion 122Q with a second substantially uniform nominal width 122W (in the gate width (GW) direction of the transistor devices) throughout its vertical height 122V, wherein the second width is greater than the first width. When viewed in a cross-section taken through the final insulating gate separation structure 122 in the gate width direction of the transistor devices, the insulating gate separation structure 122 may also be considered to have an inverted or upside down "T" shaped configuration, wherein the lower portion 122Q constitutes the horizontal line or portion of the inverted "T" and the trimmed upper exposed portion 122Z constitutes the vertical line or portion of the inverted "T." However, in the gate length (GL) direction of the transistor devices, both the trimmed upper exposed portion 122Z and the lower portion 122Q have approximately the same substantially uniform nominal width 122J throughout the overall vertical height of the final insulating gate separation structure 122.

Figure 13:
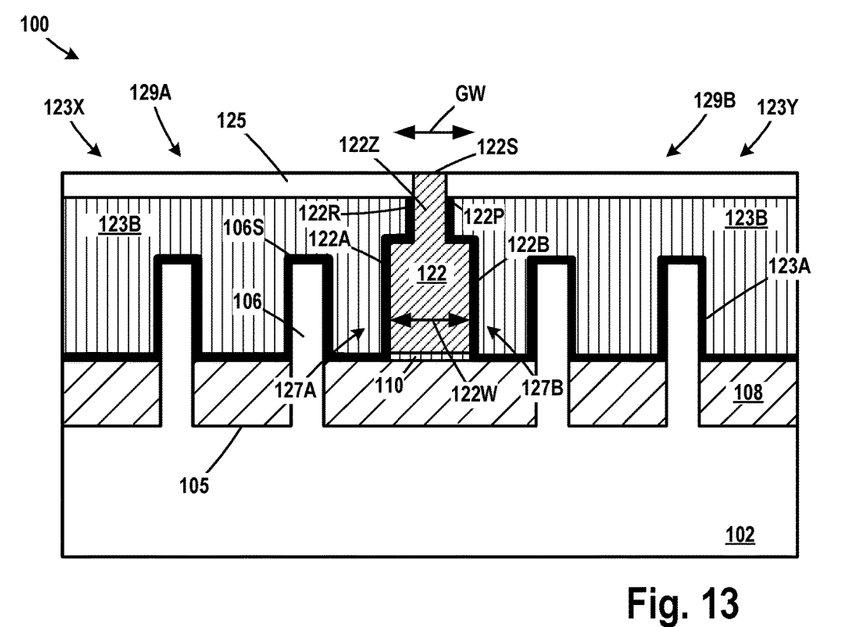

FIG. 13 depicts the product 100 after several process operations were performed to form final first and second replacement gate structures 123X, 123Y (collectively referenced using the reference numeral 123) on opposite sides of the final insulating gate separation structure 122 for the transistor devices. First, a plurality of etching processes was performed to sequentially remove the remaining portions of the recessed sacrificial gate electrode materials 114 and exposed portions of the sacrificial gate insulation layer 110. This process operation defines a plurality of replacement gate cavities 129A, 129B on opposite sides of the final insulating gate separation structure 122. The gate cavities 129A, 129B are laterally bounded (in the gate length direction) by the sidewall spacer 119 (see FIG. 12). Next, various process operations were performed to form illustrative and simplistically depicted replacement gate structures 123X, 123Y in each of the gate cavities 129A, 129B, respectively. In general, the replacement gate structure 123 may be comprised of one or more layers of insulating material that serve (in whole or part) as the gate insulation layer of the final gate structure for the transistor devices, and one or more layers of conductive material, e.g., a metal, a metal alloy, polysilicon, a work-function adjusting metal, etc., that function (in whole or part) as the conductive gate electrode of the final gate structure of the transistor devices. In the example depicted herein, the illustrative replacement gate structure 123 comprises an illustrative gate insulation layer 123A and a conductive gate electrode 123B. The thickness and composition of the materials for the replacement gate structure 123 may vary depending upon the particular application, and the relative thickness of the materials for the replacement gate structure 123 shown in the drawings is not to scale. In one illustrative example, the same materials for the replacement gate structure 123 may be used for the gate structure for both N- and P-type devices. In other applications, by formation of appropriate masking layers (not shown), the materials for the replacement gate structure 123 used for N- and P-type devices may be different. In one illustrative embodiment, the layer of insulating material 123A may be made of a high-k (k value of 10 or greater) insulating material, such as hafnium oxide, while the conductive gate electrode 123B may be comprised of a metal or a metal-containing material, such as titanium nitride (not separately shown), that functions as a work-function adjusting layer, and a bulk layer of conductive material, such as a metal, a metal alloy, tungsten or a doped polysilicon. As will be appreciated by those skilled in the art after a complete reading of the present application, the replacement gate structures 123 are intended to be representative of any type of gate structure that may be formed using replacement gate manufacturing techniques. It should be noted that the first final gate structure 123X (which includes the gate insulation layer 123A) has a first end surface 127A that contacts both the first side surface 122A of the lower portion 122Q of the insulating gate separation structure 122 as well as the side surface 122R of the trimmed upper exposed portion 122Z of the insulating gate separation structure 122. Similarly, the second final gate structure 123Y has a second end surface 127B that contacts both the second side surface 122B of the lower portion 122Q of the insulating gate separation structure 122 as well as the side surface 122P of the trimmed upper exposed portion 122Z of the insulating gate separation structure 122.

In one illustrative process flow, after formation of the materials for the replacement gate structure 123, a CMP process may be performed to remove excess materials positioned above the layer of insulating material 118 (see FIG. 12). At that point, one or more recess etching processes may be performed to remove portions of, or recess, the materials of the replacement gate structures 123 within the gate cavities 129A, 129B to make room for a final gate cap 125. The final gate cap 125 (e.g., silicon nitride) may be formed by depositing a layer of the gate cap material so as to overfill the gate cavities 129A, 129B and thereafter performing a CMP process to remove excess materials.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a first final gate structure for a first transistor device;
   a second final gate structure for a second transistor device, said first and second transistors having a gate width direction and a gate length direction that is substantially normal to said gate width direction; and
   an insulating gate separation structure positioned between said first and second final gate structures, said insulating gate separation structure comprising an upper portion and a lower portion, said lower portion having a first lateral width in said gate width direction that is substantially uniform throughout a vertical height of said lower portion, said upper portion having a substantially uniform second lateral width in said gate width direction that is substantially uniform throughout a vertical height of said upper portion, wherein said second lateral width is less than said first lateral width and wherein said insulating gate separation structure has a substantially uniform third lateral width in said gate length direction throughout an overall vertical height of said gate separation structure, wherein there is a stepped transition between said upper portion and said lower portion of said gate separation structure.

2. The integrated circuit product of claim 1, wherein said insulating gate separation structure comprises silicon nitride and said first final gate structure comprises a high-k (k value or 10 or greater) replacement gate insulation layer and a gate electrode that comprises at least one metal-containing layer of material.

3. The integrated circuit product of claim 1, wherein said first final gate structure comprises a first end surface and said second final gate structure comprises a second end surface, wherein said first end surface engages both said upper portion and said lower portion of said insulating gate separation structure on a first side of said insulating gate separation structure and said second end surface engages both said upper portion and said lower portion of said insulating gate separation structure on a second side of said insulating gate separation structure that is opposite said first side of said insulating gate separation structure.

4. The integrated circuit product of claim 1, wherein, when viewed in a cross-section taken through the gate separation structure in said gate width direction, said gate separation structure has an inverted "T" configuration.

5. The integrated circuit product of claim 1, wherein said insulating gate separation structure comprises silicon nitride.

6. The integrated circuit product of claim 1, wherein said first and second transistor devices are FinFET devices.

7. An integrated circuit product, comprising:
   a first final gate structure for a first transistor device, said first final gate structure comprising a first end surface;
   a second final gate structure for a second transistor device, said second final gate structure comprising a second end surface, said first and second transistors having a gate width direction and a gate length direction that is substantially normal to said gate width direction; and
   an insulating gate separation structure positioned between said first and second final gate structures, said insulating gate separation structure comprising an upper portion and a lower portion, said lower portion having a first lateral width in said gate width direction, said upper portion having a second lateral width in said gate width direction, wherein said second lateral width is less than said first lateral width, wherein said first end surface engages both said upper portion and said lower portion of said insulating gate separation structure on a first side of said insulating gate separation structure and said second end surface engages both said upper portion and said lower portion of said insulating gate separation structure on a second side of said insulating gate separation structure that is opposite said first side of said insulating gate separation structure and wherein, when viewed in a cross-section taken through said gate separation structure in said gate width direction, said gate separation structure has an inverted "T" configuration.

8. The integrated circuit product of claim 7, wherein said insulating gate separation structure has a substantially uniform third lateral width in said gate length direction throughout an overall vertical height of said gate separation structure.

9. An integrated circuit product, comprising:
a first final gate structure for a first transistor device comprising a first end surface;
a second final gate structure for a second transistor device comprising a second end surface, said first and second transistors having a gate width direction and a gate length direction that is substantially normal to said gate width direction; and
an insulating gate separation structure positioned between said first and second final gate structures, said insulating gate separation structure comprising an upper portion and a lower portion, said lower portion having a first lateral width in said gate width direction that is substantially uniform throughout a vertical height of said lower portion, said upper portion having a substantially uniform second lateral width in said gate width direction that is substantially uniform throughout a vertical height of said upper portion, wherein said second lateral width is less than said first lateral width and wherein said insulating gate separation structure has a substantially uniform third lateral width in said gate length direction throughout an overall vertical height of said gate separation structure, wherein said first end surface engages both said upper portion and said lower portion of said insulating gate separation structure on a first side of said insulating gate separation structure and said second end surface engages both said upper portion and said lower portion of said insulating gate separation structure on a second side of said insulating gate separation structure that is opposite said first side.

10. The integrated circuit product of claim 9, wherein said insulating gate separation structure comprises silicon nitride and said first final gate structure comprises a high-k (k value or 10 or greater) replacement gate insulation layer and a gate electrode that comprises at least one metal-containing layer of material.

11. The integrated circuit product of claim 9, wherein there is a stepped transition between said upper portion and said lower portion of said gate separation structure.

12. The integrated circuit product of claim 9, wherein, when viewed in a cross-section taken through said gate separation structure in said gate width direction, said gate separation structure has an inverted "T" configuration.

13. The integrated circuit product of claim 12, wherein said insulating gate separation structure comprises silicon nitride.

* * * * *